(12) United States Patent
Ishibashi et al.

(10) Patent No.: US 12,486,565 B2
(45) Date of Patent: Dec. 2, 2025

(54) SPUTTERING APPARATUS AND CONTROL METHOD

(71) Applicant: TOKYO ELECTRON LIMITED, Tokyo (JP)

(72) Inventors: Shota Ishibashi, Nirasaki (JP); Toru Kitada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 79 days.

(21) Appl. No.: 18/076,970

(22) Filed: Dec. 7, 2022

(65) Prior Publication Data

US 2023/0175114 A1    Jun. 8, 2023

(30) Foreign Application Priority Data

Dec. 7, 2021    (JP) .................................. 2021-198867

(51) Int. Cl.
*C23C 14/35* (2006.01)
*C23C 14/54* (2006.01)

(52) U.S. Cl.
CPC ............ *C23C 14/352* (2013.01); *C23C 14/54* (2013.01)

(58) Field of Classification Search
CPC ....... C23C 14/352; C23C 14/54; C23C 14/14; C23C 14/564; C23C 14/0036; C23C 14/35
See application file for complete search history.

(56) References Cited

U.S. PATENT DOCUMENTS

| | | | |
|---|---|---|---|
| 8,992,743 B2 * | 3/2015 | Yamaguchi ........... | C23C 14/505 204/192.15 |
| 2015/0136596 A1 * | 5/2015 | Nakamura .......... | H01J 37/3405 204/298.16 |
| 2017/0053784 A1 * | 2/2017 | Subramani .......... | H01J 37/3441 |
| 2018/0240655 A1 * | 8/2018 | Wu .................... | H01J 37/32651 |
| 2019/0144992 A1 * | 5/2019 | Kim .................... | H01J 37/3464 204/192.12 |
| 2020/0071232 A1 * | 3/2020 | Oda .................... | H01J 37/3426 |
| 2020/0211843 A1 * | 7/2020 | Economy .............. | C23C 16/045 |
| 2020/0332412 A1 * | 10/2020 | Xiao ..................... | C23C 14/542 |

FOREIGN PATENT DOCUMENTS

| | | | | |
|---|---|---|---|---|
| GB | 2399350 A | * | 9/2004 | .......... C23C 14/165 |
| JP | 6916789 B2 | | 8/2021 | |
| WO | WO-2020161957 A1 | * | 8/2020 | ......... C23C 14/0036 |

OTHER PUBLICATIONS

WO-2020161957-A1 Translation (Year: 2020).*

* cited by examiner

*Primary Examiner* — Patrick S Ott
(74) *Attorney, Agent, or Firm* — Nath, Goldberg & Meyer; Jerald L. Meyer; Tanya E. Harkins

(57) ABSTRACT

A sputtering apparatus includes: a processing container; a first target provided inside the processing container and formed of a first material; a second target provided inside the processing container and formed of a second material different from the first material; a stage provided inside the processing container to place a substrate thereon: a shielding plate arranged between the first target and the second target; and a controller, wherein the controller is configured to perform a process of reducing a film stress of a film formed on the shielding plate.

2 Claims, 4 Drawing Sheets

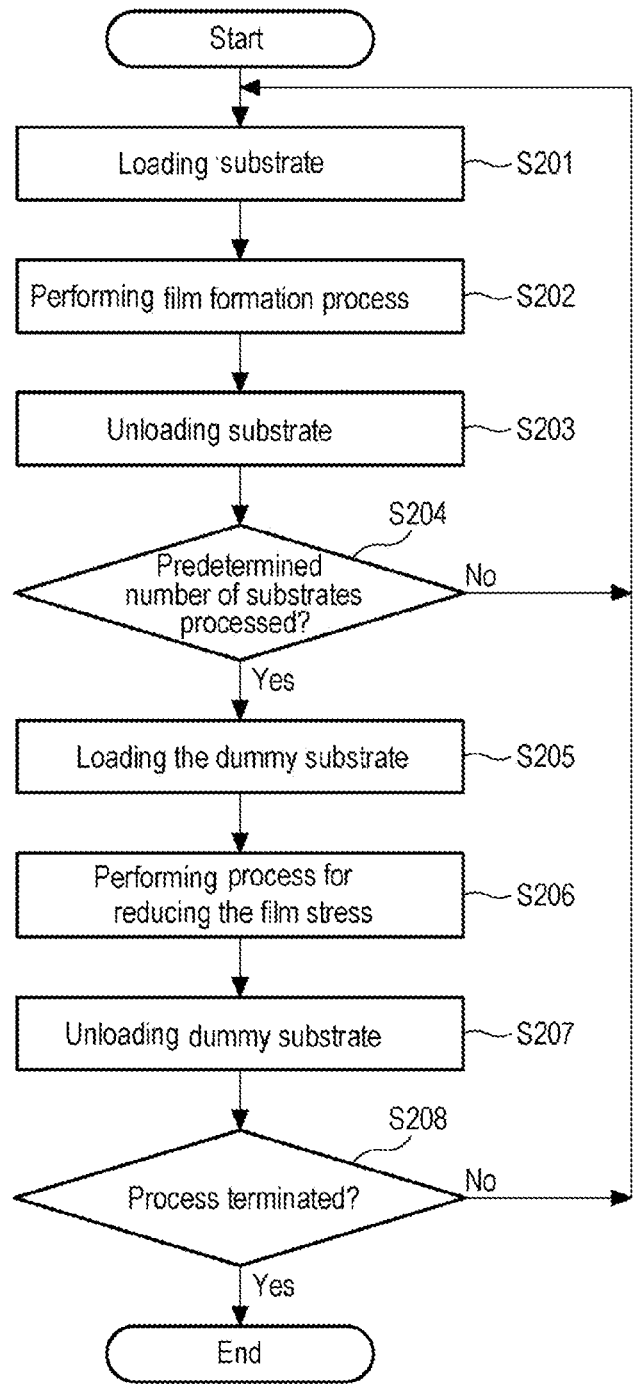

SPUTTERING APPARATUS AND CONTROL METHOD

CROSS-REFERENCE TO RELATED APPLICATION

This application is based upon and claims the benefit of priority from Japanese Patent Application No. 2021-198867, filed on Dec. 7, 2021, the entire contents of which are incorporated herein by reference.

TECHNICAL FIELD

The present disclosure relates to a sputtering apparatus and a control method.

BACKGROUND

There is known a substrate processing apparatus that forms a film by allowing sputtered particles emitted from a target to be incident on a substrate such as a wafer or the like.

In the related art, a process chamber provided with a process shield (shielding plate) extending between an adjacent pair of multiple targets is known.

SUMMARY

According to one embodiment of the present disclosure, there is provided a sputtering apparatus including: a processing container; a first target provided inside the processing container and formed of a first material; a second target provided inside the processing container and formed of a second material different from the first material; a stage provided inside the processing container to place a substrate on the stage; a shielding plate arranged between the first target and the second target; and a controller, wherein the controller is configured to perform a process of reducing a film stress of a film formed on the shielding plate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is another example of a flowchart for explaining a film formation process performed in the substrate processing apparatus.

DETAILED DESCRIPTION

Figure 1:
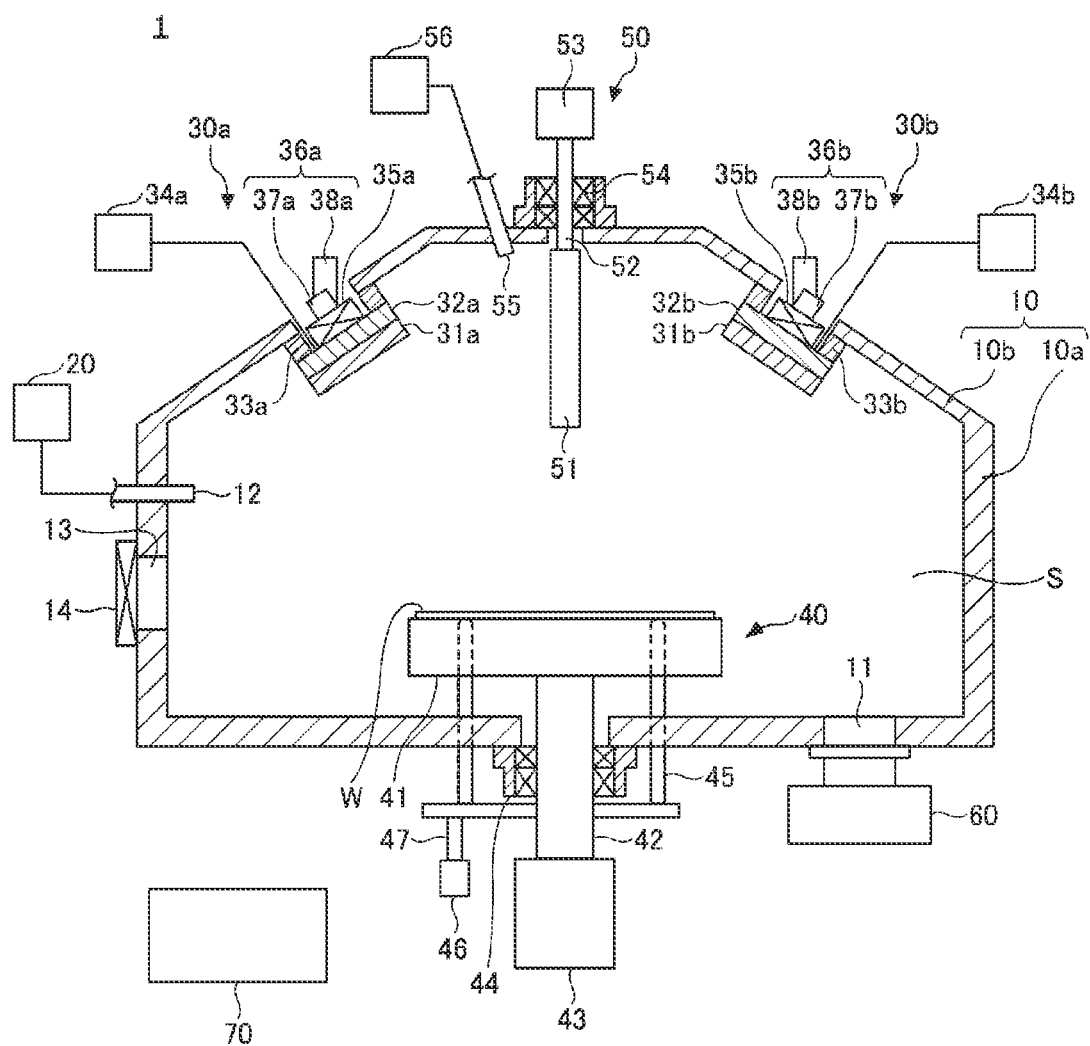
FIG. 1 is an example of a schematic sectional view of a substrate processing apparatus according to one embodiment.

Hereinafter, embodiments for carrying out the present disclosure will be described with reference to the drawings. In each drawing, the same components are designated by the same reference numerals, and the redundant description thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Substrate Processing Apparatus>

A substrate processing apparatus 1 according to one embodiment will be described with reference to FIG. 1. FIG. 1 is an example of a schematic sectional view of a substrate processing apparatus 1 according to one embodiment.

The substrate processing apparatus 1 includes a processing chamber 10, a gas supplier 20, sputtering particle emission parts 30a and 30b, a substrate support part 40, a sputtering particle shielding mechanism 50, and an exhaust device 60. The substrate processing apparatus 1 is, for example, a PVD (Physical Vapor Deposition) apparatus and is an apparatus that forms a film in the processing chamber 10 by depositing the sputtered particles (film-forming atoms) emitted from the sputtering particle emission parts 30a and 30b on the surface of a substrate W such as a semiconductor wafer or the like placed on the substrate support part 40.

The processing chamber 10 includes a chamber body 10a with an upper opening, and a lid 10b provided to close the upper opening of the chamber body 10a. The lid 10b has a side surface formed as an inclined surface. The inside of the processing chamber 10 serves as a processing space S in which a film formation process is performed.

An exhaust port 11 is formed at the bottom of the processing chamber 10. An exhaust device 60 is connected to the exhaust port 11. The exhaust device 60 includes a pressure control valve and a vacuum pump. The processing space S is evacuated to a predetermined degree of vacuum by the exhaust device 60.

A gas introduction port 12 for introducing a gas into the processing space S is inserted into the processing chamber 10. A gas supplier 20 is connected to the gas introduction port 12. A sputtering gas (e.g., an inert gas) supplied from the gas supplier 20 to the gas introduction port 12 is introduced into the processing space S.

A loading/unloading port 13 for loading and unloading a substrate W is formed in the side wall of the processing chamber 10. The loading/unloading port 13 is opened and closed by a gate valve 14. The processing chamber 10 is provided adjacent to a transfer chamber (not shown). The processing chamber 10 and the transfer chamber (not shown) are brought into communication with each other by opening the gate valve 14. The interior of the transfer chamber (not shown) is maintained at a predetermined degree of vacuum, A transfer device (not shown) for transferring the substrate W into and out of the processing chamber 10 is provided inside the transfer chamber.

The sputtering particle emission part 30a includes a target (first target) 31a, a target holder 32a, an insulating member 33a, a power source 34a, a magnet 35a, and a magnet scanning mechanism 36a. Further, the sputtering particle emission part 30b includes a target (second target) 31b, a target holder 32b, an insulating member 33b, a power source 34b, a magnet 35b, and a magnet scanning mechanism 36b.

The targets 31a and 31b are made of a material containing constituent elements of a film to be formed. The target 31a is made of a first material. The target 31b is made of a second material. In the following description, a case where the first material forming the target 31a is tungsten (W), the second material forming the target 31b is silicon (Si, and a tungsten silicide (WSi) film is formed on the substrate W will be described as an example. Since the tungsten film has a large film stress (internal stress), the film stress may cause peeling if the film thickness is increased.

The target holders 32a and 32b are made of a conductive material and are attached to different positions on the inclined surface of the lid 10b of the processing chamber 10 via the insulating members 33a and 33b. In the example shown in FIG. 1, the target holders 32a and 32b are provided at positions facing each other with the shielding plate 51 interposed therebetween. The target holders 32a and 32b hold the targets 31a and 31b so that the targets 31a and 31b are positioned obliquely above the substrate W supported by the substrate support part 40.

The power sources 34a and 34b are electrically connected to the target holders 32a and 32b, respectively. The power sources 34a and 34b may be DC power sources if the targets 31a and 31b are made of a conductive material, or may be high-frequency power sources if the targets 31a and 31b are made of a dielectric material. When the power sources 34a and 34b are the high-frequency power sources, they are connected to the target holders 32a and 32b via matching devices. By applying a voltage to the target holders 32a and 32b, the sputtering gas is dissociated around the targets 31a and 31b. Then, the ions in the dissociated sputtering gas collide with the targets 31a and 31b, and the targets 31a and 31b emit sputtered particles, which are particles of the constituent materials of the targets 31a and 31b.

The magnets 35a and 35b are arranged on the back surface side of the target holders 32a and 32b, and are configured to be reciprocated (oscillated) in the Y direction by the magnet scanning mechanisms 36a and 36b. The magnet scanning mechanisms 36a and 36b include, for example, guides 37a and 37b and drive parts 38a and 38b. The magnets 35a and 35b are guided by the guides 37a and 37b so as to reciprocate in the Y direction. The drive parts 38a and 38b cause the magnets 35a and 35b to reciprocate along the guides 37a and 37b.

The ions in the dissociated sputtering gas are attracted by the magnetic fields of the magnets 35a and 35b and collide with the targets 31a and 31b. As the magnet scanning mechanisms 36a and 36b cause the magnets 35a and 35b to reciprocate in the Y direction, the positions at which the ions collide with the targets 31a and 31b, i.e., the positions at which the sputtered particles are emitted are changed.

A stage 41 of the substrate support part 40 for horizontally placing the substrate W is provided at a position facing the targets 31a and 31b in the processing chamber 10. The stage 41 is connected to a drive mechanism 43 arranged below the processing chamber 10 via a shaft member 42. The drive mechanism 43 has a function of rotating the stage 41. Further, the drive mechanism 43 has a function of raising and lowering the stage 41 between a transfer position where the substrate W is delivered between the vacuum transfer device (not shown) and the substrate support part 40 via lift pins 45 and a processing position where sputtering is performed.

The shaft member 42 is connected to the drive mechanism 43 through the bottom of the chamber body 10a. A seal portion 44 for keeping the inside of the processing chamber 10 airtight is provided at a position where the shaft member 42 penetrates the bottom portion of the chamber body 10a.

Three lift pins 45 are provided so as to support the substrate W at three positions from the lower surface thereof, and are raised and lowered via a support member 47 by an elevating part 46.

A heating mechanism (not shown) is provided inside the stage 41 so as to heat the substrate W during sputtering.

In addition, the processing chamber 10 is provided with a sputtering particle shielding mechanism 50 for preventing so-called cross-contamination in which target particles emitted from one target 31a (or 31b) adhere to the other target 31b (or 31a).

The sputtering particle shielding mechanism 50 includes a shielding plate 51, a shaft member 52, a drive mechanism 53, and a seal part 54.

The shielding plate 51 is arranged between the targets 31a and 31b in the processing chamber 10 to prevent the target particles emitted from one target 31a (or 31b) from adhering to the other target 31b (or 31a).

The shaft member 52 is connected to the drive mechanism 53 through the lid 10b. The seal part 54 for keeping the inside of the processing chamber 10 airtight is provided at a position where the shaft member 52 penetrates the lid 10b.

A deposition suppressing gas introduction port 55 for supplying a deposition suppressing gas for suppressing deposition of target particles on the shielding plate 51 is inserted into the processing chamber 10. A deposition suppressing gas supplier 56 is connected to the deposition suppressing gas introduction port 55. The deposition suppressing gas (e.g., an inert gas) supplied from the deposition suppressing gas supplier 56 to the deposition suppressing gas introduction port 55 is sprayed onto the surface of the shielding plate 51 on the tungsten target side.

A controller 70 is composed of a computer to control the respective components of the substrate processing apparatus 1, such as the power sources 34a and 34b, the drive parts 38a and 38b, the drive mechanism 43, the elevating part 46, the drive mechanism 53, the exhaust device 60, and the like. The controller 70 includes a main control part composed of a CPU that actually controls the respective components, an input device, an output device, a display device, and a memory device. The memory device stores parameters of various processes performed by the substrate processing apparatus 1. A storage medium that stores programs for controlling the processes performed by the substrate processing apparatus 1, i.e., process recipes is set on the memory device. The main control part of the controller 70 calls up a predetermined process recipe stored in the storage medium, and causes the substrate processing apparatus 1 to execute a predetermined process based on the process recipe.

Figure 2:
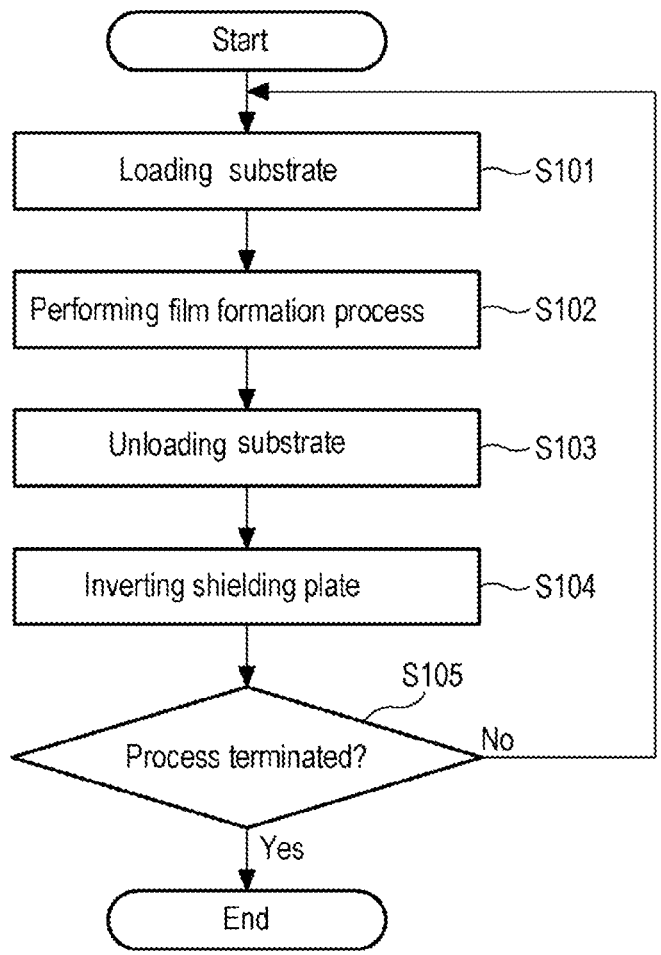
FIG. 2 is an example of a flowchart for explaining a film formation process performed in the substrate processing apparatus.

Next, a film formation process performed in the substrate processing apparatus 1 according to one embodiment will be described with reference to FIG. 2. FIG. 2 is an example of a flowchart for explaining the film formation process performed in the substrate processing apparatus 1.

In step S101, the substrate W is loaded into the processing chamber 10. Specifically, the controller 70 opens the gate valve 14. A transfer device (not shown) provided inside the transfer chamber (not shown) transfers the substrate W into the processing chamber 10 and places the substrate W on the stage 41. When the transfer device retreats from the loading/unloading port 13, the controller 70 closes the gate valve 14.

In step S102, the substrate W is subjected to a film formation process. The controller 70 controls the substrate processing apparatus 1 to form a tungsten silicide (WSi) film on the substrate W. At this time, an Ar gas as a sputtering gas is supplied from the gas introduction port 12 while rotating the stage 41, and sputtered particles are emitted from the targets 31a and 31b to form a tungsten silicide (WSi) film on the substrate W. At this time, the shielding plate 51 is provided between the targets 31a and 31b to prevent cross-contamination. Tungsten is deposited on the surface of the shielding plate 51 on the target 31a side, and silicon is deposited on the surface of the shielding plate 51 on the target 31b side.

In step S103, the substrate W is unloaded from the processing chamber 10. Specifically, the controller 70 opens the gate valve 14. The transfer device (not shown) provided inside the transfer chamber (not shown) unloads the substrate W from the stage 41 in the processing chamber 10. When the transfer device retreats from the loading/unloading port 13, the controller 70 closes the gate valve 14.

In step S104, the shielding plate 51 is turned over as a process of reducing the stress of the film formed on the shielding plate 51. Specifically, the controller 70 controls the drive mechanism 53 to turn the shielding plate 51 by 180°. In other words, the shielding plate 51 is rotated so that the surface thereof facing the target 31a and the surface thereof facing the target 31b are reversed. In other words, one surface of the shielding plate 51 deposited with tungsten faces the target 31b, and the other surface of the shielding plate 51 deposited with silicon faces the target 31a.

In step S105, it is determined whether to terminate the process. If a film formation process is performed on the next substrate W without terminating the process (S105: NO) the process of the controller 70 returns to step S101.

Then, the process of steps S101 to S103 is performed on the second substrate W. At this time, tungsten is deposited on the other surface of the shielding plate 51 on which silicon is deposited when processing the first substrate W. In addition, silicon is deposited on one surface of the shielding plate 51 on which tungsten is deposited when processing the first substrate W. By repeating process of steps S101 to S105, tungsten and silicon are alternately deposited on both surfaces of the shielding plate 51.

Then, when it is determined that the process is to be terminate (S105: YES), the controller 70 terminates the process.

Thus, according to the substrate processing apparatus 1, cross-contamination can be prevented by providing the shielding plate 51 between the targets 31a and 31b.

In other words, the sputtered tungsten particles emitted from the target 31a may adhere to the non-erosion portion of the target 31b to form a tungsten film, and the tungsten film formed on the non-erosion portion of the target 31b may be peeled by the film stress. On the other hand, the substrate processing apparatus 1 prevents the sputtered tungsten particles emitted from the target 31a from reaching the target 31b by providing the shielding plate 51 between the targets 31a and 31b. Further, it is possible to prevent a tungsten film from being formed on the non-erosion portion of the target 31b. In addition, it is possible to prevent the tungsten film peeled from the non-erosion portion of the target 31b from adhering to the surface of the substrate W.

Figure 3:
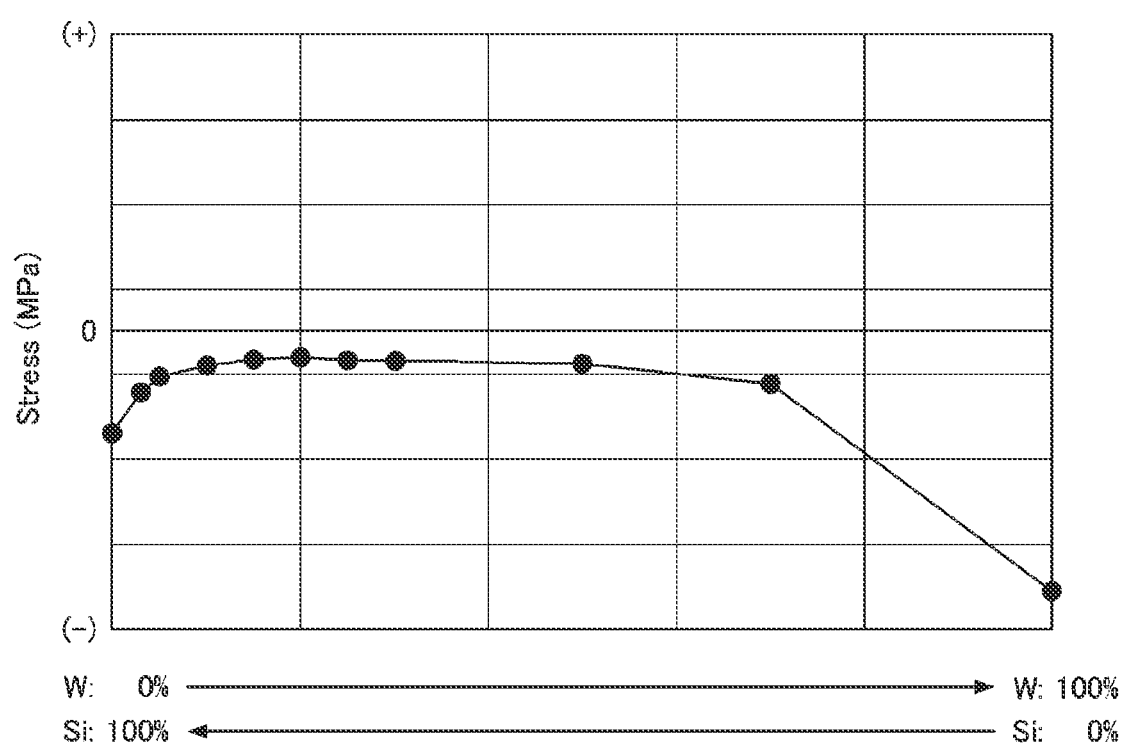
FIG. 3 is an example of a graph showing the relationship between a film composition and a film stress.

Next, the peeling of the film formed on the shielding plate 51 will be described. FIG. 3 is an example of a graph showing the relationship between film composition and film stress. The horizontal axis indicates the composition of tungsten silicide. The left end shows a silicon film (W: 0%, Si: 100%), and the right end shows a tungsten film (W: 100%, Si: 0%). The composition ratio of tungsten in tungsten silicide increases from left to right. The vertical axis indicates the film stress generated in the film. The plus side is a tensile stress and the minus side is a compressive stress.

As shown in FIG. 3, the tungsten film has a high film stress. Therefore, the tungsten deposited on the surface of the shielding plate 51 forms a tungsten film, and the film stress may cause the tungsten film to peel off from the surface of the shielding plate 51. Moreover, the peeled film ray adhere to the surface of the substrate W.

On the other hand, in the substrate processing apparatus 1, by inverting the shielding plate 51, the surface of the shielding plate 51 may have a laminated structure in which tungsten and silicon are alternately deposited. Thus, the film formed on the surface of the shielding plate 51 may be a tungsten silicide film. In this case, as shown in FIG. 3, the film formed of tungsten (WV) and silicon (Si) has lower crystallinity than the tungsten film formed of tungsten (W) alone, whereby the film stress is reduced. As a result, it is possible to suppress the peeling of the film from the surface of the shielding plate 51 and the adhesion of the peeled film to the surface of the substrate W.

In addition, as shown in FIG. 3 the composition ratio of W in the WSi film formed on the shielding plate 51 is preferably 5% or more and 70% or less. This makes it possible to reduce the film stress. Further, the composition ratio of W in the WSi film formed on the shielding plate 51 is more preferably 15% or more and 25% or less. This makes it possible to further reduce the film stress.

In the flowchart shown in FIG. 3, the shielding plate 51 is rotated each time when the film formation process is performed on one substrate W. However, the present disclosure is not limited thereto, and the shielding plate may be rotated each time when a predetermined number of substrates processed.

Further, in the flowchart shown in FIG. 3, the composition ratio of the tungsten silicide film formed on the shielding plate 51 conforms to the composition ratio of the tungsten silicide film formed on the substrate W.

Therefore, in step S102, a deposition suppressing gas (e.g., an Ar gas) is supplied from the deposition suppressing gas introduction port 55 toward the surface of the shielding plate 51 on the target 31a side. This makes it possible to suppress deposition of tungsten particles on the shielding plate 51. That is, the composition ratio of the tungsten silicide film formed on the substrate W and the composition ratio of the tungsten silicide film formed on the shielding plate 51 can be made different. As a result, even when the ratio of tungsten in the film formed on the substrate W is large (e.g., 90%), the amount of tungsten adsorbed on the shielding plate 51 is reduced by the deposition suppressing gas, whereby the ratio of tungsten in the film formed on the substrate W can be decreased, for example, from 5% to 70% to reduce the film stress.

Although the substrate processing apparatus 1 has been described as forming the WSi film (target 31a: W, target 31b: Si) on the substrate W, the present disclosure is not limited thereto. The substrate processing apparatus 1 may be configured to form films of WBSi (WB, Si), WCSi (WC, Si), WBC (WC, WB), and WRu (W, Ru).

Further, the substrate processing apparatus 1 may be configured to supply an $N_2$ gas to the processing space S to form films of WSiN (W, Si), WBSiN (WB, Si), WCSiN (WC, Si), WBCN (WC, WB), and WRuN (W, Ru).

Next, the film formation process performed in the substrate processing apparatus 1 according to one embodiment will be described with reference to FIG. 4. FIG. 4 is another example of a flowchart for explaining the film formation process performed in the substrate processing apparatus 1.

In step S201, the substrate W is loaded into the processing chamber 10. Specifically, the controller 70 opens the gate valve 14. The transfer device (not shown) provided inside the transfer chamber (not shown) transfers the substrate W into the processing chamber 10 and places the substrate W on the stage 41. When the transfer device retreats from the loading/unloading port 13, the controller 70 closes the gate valve 14.

In step S202, the substrate W is subjected to a film formation process. The controller 70 controls the substrate processing apparatus 1 to form a tungsten silicide (WSi) film on the substrate W. At this time, an Ar gas as a sputtering gas is supplied from the gas introduction port 12 while rotating the stage 41, and sputtered particles are emitted from the targets 31a and 31b to form a tungsten silicide (WSi) film on the substrate W. The shielding plate 51 is provided between the targets 31a and 31b to prevent cross-contamination. Ar-sputtered tungsten is deposited on the surface of the shielding plate 51 on the target 31a side, and silicon is deposited on the surface of the shielding plate 51 on the target 31b side.

In step S203, the substrate W is unloaded from the processing chamber 10. Specifically, the controller 70 opens the gate valve 14. The transfer device (not shown) provided inside the transfer chamber (not shown) unloads the substrate W from the stage 41 in the processing chamber 10. When the transfer device retreats from the loading/unloading port 13, the controller 70 closes the gate valve 14.

In step S204, it is determined whether or not a predetermined number of substrates W have been processed. If the predetermined number of substrates W have not been processed, the controller 70 repeats the process of steps S201 to S203. After the predetermined number of substrates W have been processed, the process executed by the controller 70 proceeds to step S205.

In step S205, a dummy substrate is loaded into the processing chamber 10. Specifically, the controller 70 opens the gate valve 14. The transfer device (not shown) provided inside the transfer chamber (not shown) transfers the dummy substrate into the processing chamber 10 and places the dummy substrate on the stage 41. When the transfer device retreats from the loading/unloading port 13, the controller 70 closes the gate valve 14. The dummy substrate has the same shape as the substrate W.

In step S206, as a process of reducing the stress of the film formed on the shielding plate 51, the target 31a is sputtered under processing conditions different from those in step S202. At this time, a Kr gas is supplied as a sputtering gas from the gas introduction port 12, and sputtered particles are emitted from the targets 31a and 31b. As a result, tungsten sputtered with Kr is deposited on the surface of the shielding plate 51 on the target 31a side.

In step S207, the dummy substrate is unloaded from the processing chamber 10. Specifically, the controller 70 opens the gate valve 14. The transfer device (not shown) provided inside the transfer chamber (not shown) unloads the dummy substrate from the stage 41 in the processing chamber 10, When the transfer device retreats from the loading/unloading port 13, the controller 70 closes the gate valve 14.

In step S208, it is determined whether to end the process. If a film formation process is to be performed on the next substrate W without terminating the process (S208: NO), the process controlled by the controller 70 returns to step S201. Then, when it is determined to terminate the process (S208: YES), the process controlled by the controller 70 is terminated.

Thus, according to the substrate processing apparatus 1, cross-contamination can be prevented by providing the shielding plate 51 between the targets 31a and 31b.

Further, the film stress of the tungsten film formed of tungsten sputtered with the Ar gas is a compressive stress. On the other hand, the film stress of the tungsten film formed of tungsten sputtered with the Kr gas is a tensile stress.

That is, on surface of the shielding plate 51 on the target 31a side, compressive stress films and tensile stress films are alternately laminated. Thus, it is possible to reduce the film stress of the film formed on the surface of the shielding plate 51 on the target 31a side. As a result, it is possible to suppress the peeling of the film from the surface of the shielding plate 51, and to suppress the adhesion of the peeled film to the surface of the substrate W.

The metal material in which orientation of film stress is changed between the Ar gas and the Kr gas is not limited to W, but may be Mo, Cr, and the like. Films of these metals may be applied in the same manner as W.

According to the present disclosure in some embodiments, it is possible to provide a sputtering apparatus and a control method for suppressing peeling of a film from a shielding plate arranged between targets.

Although the substrate processing apparatus 1 has been described above, the present disclosure is not limited to the above embodiments and the like, and various modifications and improvements may be made within the scope of the present disclosure described in the claims.

What is claimed is:

1. A control method in a sputtering apparatus including a processing container, a first sputtering particle emission part including a first target provided inside the processing container and formed of a first material including W, a first target holder attached on a first inclined surface of the processing container to hold the first target, a first magnet arranged on a back surface side of the first target holder, and a first magnet scanning mechanism causing the first magnet to reciprocate along the first inclined surface, a second sputtering particle emission part including a second target provided inside the processing container and formed of a second material different from the first material, a second target holder attached on a second inclined surface of the processing container to hold the second target, a second magnet arranged on a back surface side of the second target holder, and a second magnet scanning mechanism causing the second magnet to reciprocate along the second inclined surface, a stage provided inside the processing container to place a substrate thereon, a shielding plate arranged between the first target and the second target, a drive mechanism configured to rotate the shielding plate, a suppressing gas supplier configured to supply a suppressing gas for suppressing deposition of sputtered particles sputtered from the first target on the shielding plate, and a suppressing gas introduction port installed in a first target side of the shielding plate and configured to supply the suppressing gas supplied from the suppressing gas supplier toward a first surface of the shielding plate facing the first target,
wherein the drive mechanism rotates the shielding plate so that the first surface of the shielding plate facing the first target and a second surface of the shielding plate facing the second target are reversed to laminate a film of the first material and a film of the second material on the shielding plate.

2. A control method in a sputtering apparatus including a processing container, a first sputtering particle emission part including a first target provided inside the processing container and formed of a first material including W, a first target holder attached on a first inclined surface of the processing container to hold the first target, a first magnet arranged on a back surface side of the first target holder, and a first magnet scanning mechanism causing the first magnet to reciprocate along the first inclined surface, a second sputtering particle emission part including a second target provided inside the processing container and formed of a second material different from the first material, a second target holder attached on a second inclined surface of the processing container to hold the second target, a second magnet arranged on a back surface side of the second target holder, and a second magnet scanning mechanism causing the second magnet to reciprocate along the second inclined surface, a stage provided inside the processing container to place a substrate thereon, a shielding plate arranged between the first target and the second target, a drive mechanism configured to rotate the shielding plate, a suppressing gas supplier configured to supply a suppressing gas for suppressing deposition of sputtered particles sputtered from the first target on the shielding plate, and a suppressing gas introduction port installed in a first target side of the shielding plate and configured to supply the suppressing gas supplied from the suppressing gas supplier toward a first surface of the shielding plate facing the first target, the control method comprising:

performing a film formation process on the substrate by supplying an Ar gas into the processing container and sputtering the first target and the second target;

forming films having different film stress orientations on the shielding plate by supplying a Kr gas into the processing container and sputtering the first target; and repeating the performing the film formation process and the forming the films having different film stress orientations, wherein the drive mechanism rotates the shielding plate so that the first surface of the shielding plate facing the first target and a second surface of the shielding plate facing the second target are reversed to laminate a film of the first material and a film of the second material on the shielding plate.

* * * * *